(12) United States Patent
Winterhalter et al.

(10) Patent No.: US 8,190,969 B2
(45) Date of Patent: May 29, 2012

(54) PLASMA PROCESS POWER DELIVERY SYSTEM AND METHOD WITH EVENT-CONTROLLED DATA STORAGE

(75) Inventors: Markus Winterhalter, Bad Krozingen (DE); Ekkehard Mann, Grundelfingen (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 1411 days.

(21) Appl. No.: 11/750,573

(22) Filed: May 18, 2007

(65) Prior Publication Data

US 2007/0294608 A1 Dec. 20, 2007

(30) Foreign Application Priority Data

May 18, 2006 (DE) .......................... 10 2006 023 232

(51) Int. Cl.
*G01R 31/28* (2006.01)
(52) U.S. Cl. .................. 714/763; 714/766; 345/211
(58) Field of Classification Search .................. 714/763, 714/766, 768, 773; 345/211
See application file for complete search history.

(56) References Cited

U.S. PATENT DOCUMENTS

| | | | |
|---|---|---|---|
| 5,116,482 A | 5/1992 | Setoyama et al. | |
| 5,892,198 A | 4/1999 | Barnes et al. | |
| 5,971,591 A | 10/1999 | Vonna et al. | |
| 6,313,584 B1 * | 11/2001 | Johnson et al. | 315/111.21 |
| 6,522,121 B2 * | 2/2003 | Coumou | 324/76.19 |
| 6,528,949 B2 | 3/2003 | Hao | |
| 6,776,872 B2 | 8/2004 | Tanaka et al. | |
| 6,783,626 B2 | 8/2004 | Kim et al. | |
| 6,868,310 B2 * | 3/2005 | Nasman et al. | 700/291 |
| 7,480,571 B2 * | 1/2009 | Howald et al. | 702/1 |
| 7,564,453 B2 * | 7/2009 | Van Dalfsen et al. | 345/211 |
| 2005/0040794 A1 | 2/2005 | Tracy et al. | |

FOREIGN PATENT DOCUMENTS

| | | |
|---|---|---|
| DE | 40 29 984 | 4/1991 |
| DE | 19756 445 | 2/1999 |
| EP | 1 248 167 | 10/2002 |

\* cited by examiner

*Primary Examiner* — Fritz Alphonse
(74) *Attorney, Agent, or Firm* — Fish & Richardson P.C.

(57) ABSTRACT

A plasma process power delivery system includes one or more event-ascertaining devices within the plasma process power delivery system, a controller in communication with the one or more event ascertaining devices, a first memory, a second memory, a data transmission connection, and a plasma process monitoring system. The data transmission connection is between the first memory and the second memory and is configured to transmit data relating to the plasma process power delivery system between the first memory and the second memory in response to an occurrence of a predefined event ascertained by one or more event-ascertaining devices. The plasma process monitoring system is in communication with the second memory and analyzes circumstances associated with the event that triggers the storage in the second memory using the data stored in the second memory.

34 Claims, 1 Drawing Sheet

PLASMA PROCESS POWER DELIVERY SYSTEM AND METHOD WITH EVENT-CONTROLLED DATA STORAGE

CROSS REFERENCE TO RELATED APPLICATION

This application claims priority under 35 U.S.C. §119(a) to German Patent Application 10 2006 023 232.1, filed May 18, 2006, the entire contents of which is hereby incorporated by reference.

TECHNICAL FIELD

The invention relates to a method for data storage in a plasma process power delivery system and a plasma process power delivery system.

BACKGROUND

When new plasma processes are first put into operation and there is not yet much experience of the new conditions, it is desirable to be able to analyze the circumstances for the occurrence of a particular event and the behavior of the plasma process during the occurrence of the event so that errors can be specifically sought and the process can be developed and improved. This can be accomplished, for example, by recording data relating to the plasma process.

For example, U.S. Pat. No. 6,868,310 B2 discloses a predictive failure scheme for a power delivery system. The power delivery system includes a plurality of modules that are connected to a system monitor. The system monitor collects data on the operating parameters of each module and environmental parameters. The system monitor analyses the data to define events depending on the parameters. The parameters are then compared with a set of rules to determine whether a warning or a fault indicator should be generated.

SUMMARY

In one general aspect, a method of storing data in a plasma process power delivery system includes storing data relating to the plasma process power delivery system in a first memory, determining an occurrence of a predefined event within the plasma process power delivery system, if the predefined event occurs, then transmitting at least some of the data that is stored in the first memory to the second memory such that the transmitted data are stored in the second memory, and analyzing circumstances associated with the predefined event using the data stored in the second memory.

Implementations can include one or more of the following features. For example, the circumstances associated with the predefined event can be analyzed by analyzing the circumstances that caused the predefined event that triggered the storage of the data in the second memory.

The circumstances associated with the predefined event can be analyzed by analyzing the circumstances that were present within the plasma process power delivery system following the occurrence of the event.

The second memory can have a greater storage capacity than the first memory. The data can be stored in the first memory by a controller of the plasma process power delivery system. The data can be stored in the first memory by storing the data at predefined time intervals. The data can be stored at predefined time intervals by storing the data at intervals less than or equal to about 50 ms. The data can be stored at predefined time intervals by storing the data at intervals less than or equal to about 20 ms.

The data can be stored in the first memory by storing the data according to the FIFO principle.

The data of the first memory can be stored in the second memory by storing the data after a predefined time has elapsed following detection of the occurrence of the event.

The occurrence of the predefined event can be determined by evaluating data using an evaluation algorithm and comparing the result with one or more predefined events.

The method can include setting the predefined events. The method can include classifying the predefined events. The method can include combining the data to form data sets. The method can include storing the data with a time stamp. The method can include configuring the beginning, the end, or both the beginning and the end of the data storage in the first memory. The method can include setting the amount of data stored in the second memory before, after, or both before and after the occurrence of the predefined event.

The data relating to the plasma process power delivery system can include data relating to one or more of the plasma process within or near a plasma chamber of the plasma process power delivery system, and environmental parameters associated with the plasma process power delivery system.

The event within the plasma process power delivery system can include events within or near plasma chamber of the plasma process power delivery system, and events within an environment of the plasma process power delivery system.

In another general aspect, a plasma process power delivery system includes one or more event-ascertaining devices within the plasma process power delivery system, a controller in communication with the one or more event ascertaining devices, a first memory, a second memory, a data transmission connection, and a plasma process monitoring system. The data transmission connection is between the first memory and the second memory and is configured to transmit data relating to the plasma process power delivery system between the first memory and the second memory in response to an occurrence of a predefined event ascertained by one or more event-ascertaining devices. The plasma process monitoring system is in communication with the second memory and analyzes circumstances associated with the even that triggers the storage in the second memory using the data stored in the second memory.

Implementations can include one or more of the following features. For example, the one or more event ascertaining devices can include one or more of sensors and measuring devices.

The circumstances associated with the event can include one or more of circumstances that caused the event and circumstances that were present following the occurrence of the event.

The plasma process power delivery system can includes an evaluation device that determines the occurrence of the predefined event from the signals of the one or more event ascertaining devices.

The first memory can be a volatile memory and the second memory can be a non-volatile memory. The first memory can be a ring memory. The second memory can be a component of the plasma process monitoring system. The plasma process monitoring system can include a computer with a hard disk.

The plasma process power delivery system can include means for predefining events, for classifying events, for configuring a memory module of the first memory, or for determining the amount of data stored in the second memory before and after the occurrence of the predefined event.

The first memory can be within a power generator that generates power for supplying a plasma process in a plasma chamber. The plasma process monitoring system can be external to the power generator. The first memory can be within the controller. The controller can be within the power generator.

The plasma process power delivery system can include an evaluation device that determines whether the predefined event has occurred based on information from the one or more event-ascertaining devices. The evaluation device can be within a power generator that generates power for supplying a plasma process in a plasma chamber.

The method and the plasma process power delivery system are designed to allow rapid process development of a vacuum plasma process.

In one general aspect, a method for data storage in a plasma process power delivery system is described in which data are stored in a first memory, the occurrence of a predefined event is determined, with the occurrence of the event, at least some of the data stored in the first memory are stored in a second larger memory, and the circumstances that have caused the event that triggers the storage in the second memory and/or were present following the occurrence of the event are analyzed using the data stored in the second memory.

The use of a small memory has the advantages that a smaller memory can be written to relatively rapidly. Thus, data can be stored with a high (temporal) resolution. Many of these data can be unimportant, however, and can be overwritten and therefore, it can be unnecessary to tore all these data permanently. Thus, it is also not necessary to transfer all these data to an external larger memory. During the evaluation of data (for example, data to be stored, stored data, or current data not provided for storage), however, events can occur with the result that the plasma process power delivery system, in particular, its power generator, must execute an action. For example, the plasma process power delivery system can be configured such that the power generator interrupts or throttles the power delivery in the event of a short circuit or the occurrence of an arc in the plasma process. If the circumstances that led to the short circuit or that resulted in an arc are to be analyzed, it is advantageous if data, in particular, data from the plasma process power delivery system, the plasma process or environmental parameters close in time to the event are transmitted from the smaller memory to the larger memory. The transmitted data can then be used at a later time to analyze the circumstances of the event. The invention thus relates to event-controlled data storage.

It is not necessary to transmit all the data continuously since the interfaces could thus be overloaded by such continuous data transmission. In some cases, interfaces can be to slow for such quantities of data.

In some implementations, the first memory is a volatile memory and the second memory is a non-volatile memory. The data can be stored very rapidly in a volatile memory and the volatile memory is cost-effective. However, the data in the volatile memory can be lost if the system is shut down. Thus, data stored in the first memory can be transferred to a non-volatile memory that is not deleted when the system is switched off.

In other implementations, the data can be stored in the first memory by a controller. The controller can select which data are stored. In addition, data that has been processed and determined by the controller, which may be necessary for analyzing an event, can be stored.

In some implementations, data can be stored in the first memory at predefined time intervals, for example, at intervals $\leq$ about 50 ms, or $\leq$ about 20 ms. As a result, the sequence of a procedure in the plasma process or in the plasma process power delivery system can be stored and then analyzed. In particular, it is possible to store a large number of data per time unit, that is, data having a high time density, relating to the history of an event (and possibly also the behavior after occurrence of the event).

The data can be stored in the first memory according to the first-in-first-out (FIFO) principle. This ensures that the data are written in the second memory in the time sequence in which they were recorded and thus are available chronologically.

The first memory can be configured as a ring memory; in this way, the storage space and therefore also the amount of data can be kept small. This ensures that the most up-to-date data on the occurrence of an event are available in each case.

Data are only available for a limited time in a ring memory if the continuous storage of data is not interrupted. In the case of certain events, for example, interruption of the generator power delivery to a plasma process, a controller does not continue to overwrite data in the ring memory since further recording would not be needed. In the case of other events, for example, when an arc is detected, however, power delivery can be continued again after a short interruption and the writing of the ring memory can be continued. In such cases, the data in the ring memory can only be accessed as long as the data is not overwritten again. Thus, during or after the occurrence of an event, the data in the ring memory are stored in the second memory so that they are also available subsequently for analysis.

In some implementations, the data of the first memory are only transmitted to the second memory and stored in the second memory after a predefined time has elapsed following detection of the occurrence of the event. It is thereby possible to still record data in the first memory after the occurrence of an event and then transmit this together with the data before the occurrence of the event to the second memory. It is thereby possible not only to determine what has led to the event but also to determine what effect the event has caused. The response of the system and/or the plasma process to the event can thus be determined. This information can then be used for further process development.

In other implementations, the occurrence of a predefined event can be determined by evaluating data using an evaluation algorithm and comparing the result with one or more predefined events. In this case, the data can come from sensors, for example, for monitoring voltage and current at various locations of the generator, from a power measurement using directional couplers, phase measurements, etc. In addition, data from sensors located outside the generator can also be taken into account, for example, voltage, current, and phase sensors in the immediate vicinity of a plasma chamber, before, after, or in an adapter member between a generator and a plasma chamber. External sensors can also be light sensors and pressure sensors in or on the plasma chamber. The predefined events can be events that lead to an action on the part of the power generator.

The predefined events can be set. Thus, not only fixedly (for example, at the factory) predefined events can be analyzed but a user can also define events whose occurrence is then examined.

If the predefined events can be classified, events that do not result in "any action straight away" can also be defined. As a result, for example, the frequency and the circumstances of the occurrence of a "near event" can be determined. An event can, for example, be a change in a desired value.

The filing of data can be facilitated if the data are combined to form data sets. For example, all the data determined at one time point can be combined to form a data set in the first memory. A plurality of such data sets can be transmitted together to the second memory at the occurrence of the event. All these data pertaining to an event can then be combined to a superordinate data set in the second memory. This in turn allows data sets to be filed in order and analyzed after events.

A more accurate analysis can be made if the data are stored with a time stamp. A time stamp can be filed together with the data in a data set. It is also feasible to provide a data set with a time stamp.

In other implementations, the time at which the data storage in the first memory begins and/or the time at which the data storage in the first memory ends need not be fixed and can be configured. The time at which the data storage in the first memory begins and/or the time at which the data storage in the first memory ends can be triggered, for example, by external events, for example, by a change in the desired value of the power output of the plasma process power delivery system. As another example, the time at which the data storage in the first memory begins and/or the time at which the data storage in the first memory ends can be set or chosen by a user.

Further advantages are obtained if the amount of data stored in the second memory before and/or after the occurrence of the predefined event is set. Sequences before and after the occurrence of an event can thus be recorded with a high accuracy.

In another general aspect, a plasma process power delivery system includes a controller that is in communication with one or a plurality of sensors and/or measuring devices, a first memory, and a second memory. A data transmission connection is provided between the first memory and the second memory, through which data is transmitted event-dependently from the first memory to the second memory. The plasma process power delivery system includes a plasma process monitoring system that is configured to analyze the circumstances that have caused the event that triggers the storage in the second memory and/or that were present following the occurrence of the event, using the data storage in the second memory. The controller can be the controller of a power generator of the plasma process power delivery system. Depending on the configuration of the power generator, the plasma process power delivery system can include a high-frequency (HF), a medium-frequency (MF), or a direct-current (DC) plasma process power delivery system. The data transmission connection can be unidirectional or bidirectional. Furthermore, the data transmission connection can be configured as a wired or wireless connection, for example, a radio or an optical connection. The sensors can record internal quantities of the plasma process power delivery system, including the plasma chamber or environmental parameters. In particular, the sensors can be sensors allocated to the generator, to the connection between the generator and the plasma chamber, or to the plasma chamber. Light and/or pressure sensors can be allocated to the plasma chamber, for example.

In another implementation, the plasma process power delivery system can include an evaluation device that determines the occurrence of a predefined event from the signals of the sensors and/or measuring devices. Data are only transferred from the first memory to the second memory when such an event occurs. The amount of data stored in the second memory can thus be limited.

The first memory can be a volatile memory and the second memory can be a non-volatile memory. In the volatile memory, data can be stored relatively rapidly with a high time resolution, i.e., at short time intervals. Data not required can be very rapidly overwritten again. Only required data of interest for evaluating an event are transmitted to the second memory where they can be stored for a fairly long time and can be analyzed, for example, only after the end of a test run of a plasma process.

The first memory can be a ring memory (FIFO memory). As a result, the oldest data are overwritten by the newest data in each case. In this way, the data can be stored and read out immediately before and/or immediately after the occurrence of an event.

In other implementations, the second memory can be a component of an external plasma process monitoring system. It is thereby possible on the one hand to analyze the data at a distance from the plasma process power delivery system and on the other hand it can be ensured that when the plasma process power delivery system is shut down, the data in the second memory are not lost.

In other implementations, the plasma process monitoring system can be a computer with a hard disk. In this case, the computer can be a personal computer (PC) that is connected to a power supply network or it can be a battery-operated or rechargeable-battery computer, for example, a laptop or notebook.

The data can be analyzed with a high degree of accuracy if mean are provided for predefining events and/or for classifying events and/or for configuring a memory module of the first memory and/or for determining the amount of data stored in the second memory before and after the occurrence of the predefined event. Thus, the data stored and used for analysis can be tailored.

Further advantages of the invention can be extracted from the description and the drawings. The features mentioned above and below can be utilized individually or collectively in arbitrary combination. The embodiments shown and described are not to be understood as exhaustive enumeration but have exemplary character for describing the invention.

DETAILED DESCRIPTION

Figure 1:
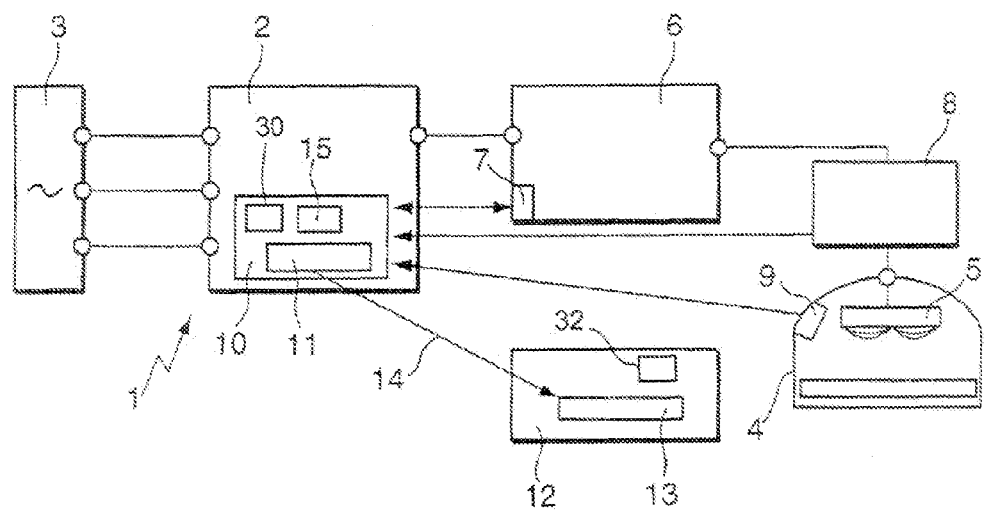
FIG. 1 is a schematic block diagram of a plasma process power delivery system.

FIG. 1 shows a plasma process power delivery system 1 including a power generator 2 that is connected to a voltage supply network 3. Depending on the configuration of the power generator 2, the plasma process power delivery system 1 can be a high-frequency (HF), a medium-frequency (MF), or a direct current (DC) plasma process power delivery system. The power generator 2 generates power for supplying a plasma process that takes place in a plasma chamber 4, which has one or more electrodes 5.

The power generator 2 includes a controller 10, a first memory 11, and an evaluation device 15. The power delivery system 1 also includes a plasma process monitoring system 12 that has a second memory 13 that is embodied as a non-volatile memory and has a storage capacity that is greater than the storage capacity of the first memory 11. Provided between the first memory 11 and the second memory 13 is a data transmission connection 14 that allows at least a transmission of data between the first memory 11 and the second memory 13.

The first memory 11 can be provided within the power generator 2 and can be a volatile memory in which data can be stored relatively rapidly with a relatively higher time resolution (that is, at shorter time intervals). Thus, data not needed are overwritten quickly within the first memory 11. For example, the first memory 11 can be a ring memory (FIFO memory) in which the oldest data are overwritten by the newest data in each case. Thus, the data can be stored and read out immediately before and/or immediately after an occurrence of an event so that the storage space within the first memory 11 is kept relative small when compared with the storage space within the second memory 13. The first memory 11 can be configured such that data content is lost when the power generator 2 is shut down.

An impedance matching network 6 is connected between the power generator 2 and the plasma chamber 4 for matching the impedance of the plasma process to the power generator 2. Additionally, a plurality of event ascertaining devices such as sensors or measuring devices are provided in the plasma process power delivery system 1. For example, sensors 7 can be provided in the impedance matching network 6 or measuring devices 8 can be provided between the impedance matching network 6 and the plasma chamber 4 to measure the current, the voltage, and/or the power delivered to the plasma chamber 4. Furthermore, sensors 9 can also be provided at the plasma chamber 4 itself. The sensors 9 at the plasma chamber 4 can be, for example, light and/or pressure sensors.

The data recorded by the sensors 7, 9 or by the measuring devices 8 are transmitted to the controller 10 of the power generator 2, where the power output can be controlled and/or regulated by the controller 10 with reference to the recorded data. The newest data that is transmitted to the controller 10 overwrites the oldest data stored in the first memory 11 in each case. The data stored in the first memory 11 is thus limited. The controller 10 can select which data are to be stored within the first memory 11.

The data transmission through the data transmission connection 14 can be bi-directional or uni-directional (for example, form the first memory 11 to the second memory 13). In some implementations, the data transmission connection 14 can be a wired connection. In other implementations, the data transmission connection 14 can be a wireless connection, such as, for example, a radio or optical connection. The data stored in the second memory 13 can be analyzed in the plasma process monitoring system 12.

The evaluation device 15 can also be provided within the power generator 2. The evaluation device 15 determines whether a predefined event has occurred based on information from one or more of the sensors 7, 9 and the measuring device 8. The data or a portion of the data stored within the first memory 11 are therefore only transmitted from the first memory 11 to the second memory 13 if the evaluation device 15 determines that the predefined event has occurred.

The plasma process monitoring system 12 can be a computer having a hard disk. For example, the plasma process monitoring system 12 can be a personal computer (PC) connected to a power supply network or a batter-operated or rechargeable battery computer (such as used for laptop computers).

One or more of the controller 10 and the plasma process monitoring system 12 can be equipped with a respective user interface 30, 32 that enables, by way of software stored within the controller 10 and/or the monitoring system 12, a user to predefine (by selecting or setting) certain events, to classify events, to configure the first memory 11 and/or the second memory 13, and/or to determine an amount of data stored in the second memory 13 before and after the occurrence of the predefined event. Moreover, if the data transmission connection 14 is bi-directional, then only one user interface 30 or 32 need be sufficient.

Figure 2:
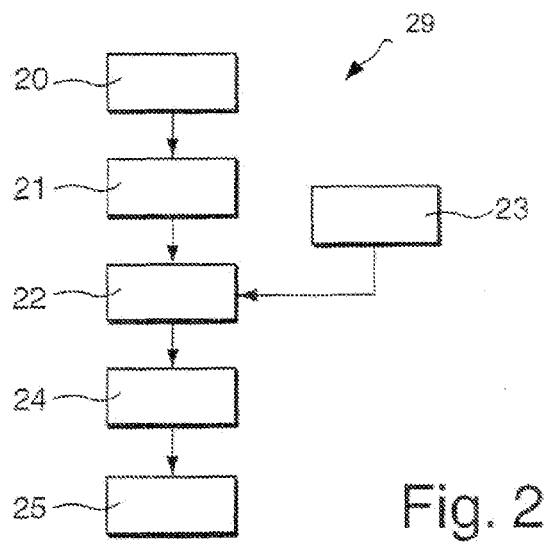
FIG. 2 is a flow chart of a procedure of the operation of the plasma process power delivery system of FIG. 1.

Referring to FIG. 2, the plasma process power delivery system 1 performs a procedure 29 for event-controlled data storage. Initially, data are recorded by the sensors 7, 9 or by measuring devices 8 (step 20). The data recorded by the sensors 7, 9, and/or the measuring devices 8 can be internal quantities of the plasma process power delivery system 1, including, for example, plasma chamber or environmental parameters. The data from the sensors 7, 9 and/or the measuring device 8 can include information about the voltage, current, or phase near the plasma chamber 4, or voltage, current, or phase between the power generator 2 can the plasma chamber 4.

Next, the data or at least some of the recorded data are stored in a first memory 11 (step 21). For example, the controller 10 can cause the data to be stored in the first memory 11. The data need not be stored permanently within the first memory 11. The data can be stored in the first memory 11 at predetermined time intervals, for example, at intervals of less than or equal to about 50 ms, or at intervals of less than or equal to about 20 ms. In some implementations, the data stored within the first memory 11 can be combined to form data sets. For example, all of the data determined at one point in time can be combined to form a data set in the first memory 11. The data can be stored within the first memory 11 with time stamps that each indicate a time that the data is stored. Moreover, the time stamp can be saved with the data in the data set or the data set can be provided with a time stamp. The data can be stored within the first memory 11 in response to a trigger event, for example, by a change in a desired value of a power output of the plasma process power delivery system 1.

An event that would trigger the plasma process power delivery system 1 to transfer memory from the first memory 11 is predefined (step 23). Events that can provide such a trigger include, for example, a short circuit or an occurrence of an arc in the plasma chamber 4 that would require the power generator 2 to interrupt or throttle power delivery to the plasma chamber 4. One or more of the predefined events can be stored within the controller 10 and/or set at the factory. Or, one or more of the predefined events can be set by a user after delivery of the power delivery system 1. Moreover, the user can re-set any one or more of the predefined events after or during operation of the power delivery system 1. Additionally, the predefined events can be classified according to how the power delivery system 1 should react to such events. For example, some predefined events can be those events that do not result in any immediate action. As another example, an event can be a change in a desired operating value of the power delivery system 1.

The plasma process power delivery system 1 determines whether the event predefined in step 23 has occurred (step 22). For example, the evaluation device 15 can make this determination by evaluating information from one or more of the sensors 7, 9 and the measuring device 8 using an evaluation algorithm stored within the controller 10, and by comparing the information to one or more predefined events.

If the plasma process power delivery system 1 determines that the predefined event has occurred (step 22), then at least some of the data from the first memory 11 is transmitted to and then subsequently stored within the second memory 13 (step 24). the data (or a portion of the data) from the first memory 11 can be transmitted to the second memory 13 through the data transmission connection 14.

In some implementations, data from the first memory 11 can be transmitted to and stored at the second memory 13 only after a predefined time has elapsed following the determination that the predefined event occurred at step 22. Data can be recorded in the first memory 11 after the occurrence of an event and then this recently recorded data can be transmitted with data that was recorded prior to the occurrence of the event to the second memory 13. In this way, the plasma process power delivery system 1 can determine not only what caused or led up to the event but also the impact or effect of the event.

In some implementations, the amount of data that is stored within the second memory 13 before and/or after the occurrence of the predefined event can be adjusted or set. Thus, sequences before or after the occurrence of the event can be recorded with higher accuracy.

In some implementations, the data stored within the second memory 13 can be combined to form data sets (or can be transferred to the second memory 13 from the first memory 11 in the form of data sets). For example, all of the data determined at one point in time can be combined to form a data set in the second memory 13. The data can be stored within the second memory 13 with time stamps that each indicate a time that the data is stored within either the first memory 11 or the second memory 13. Moreover, the time stamp can be saved with the data in the data set or the data set can be provided with a time stamp.

Next, the plasma process power delivery system 1 analyzes and evaluates the data stored in the second memory 13 (step 25). In particular, for example, the plasma process monitoring system 12 can access the data within the second memory 13 and perform data analysis on the data to determine the circumstances that caused the event.

Other Embodiments

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of storing data in a plasma process power delivery system, the method comprising:
   storing data relating to the plasma process power delivery system in a first memory;
   determining an occurrence of a predefined event within the plasma process power delivery system;
   if the predefined event occurs, then transmitting at least some of the data that is stored in the first memory to the second memory such that the transmitted data are stored in the second memory; and
   analyzing circumstances associated with the predefined event using the data stored in the second memory.

2. The method of claim 1, wherein analyzing the circumstances associated with the predefined event comprises analyzing the circumstances that caused the predefined event that triggered the storage of the data in the second memory.

3. The method of claim 1, wherein analyzing the circumstances associated with the predefined event comprises analyzing the circumstances that were present within the plasma process power delivery system following the occurrence of the event.

4. The method of claim 1, wherein the second memory has a greater storage capacity than the first memory.

5. The method of claim 1, wherein the data are stored in the first memory by a controller of the plasma process power delivery system.

6. The method of claim 1, wherein storing the data in the first memory comprises storing the data at predefined time intervals.

7. The method of claim 6, wherein storing the data at predefined time intervals comprises storing the data at intervals less than or equal to about 50 ms.

8. The method of claim 6, wherein storing the data at predefined time intervals comprises storing the data at intervals less than or equal to about 20 ms.

9. The method of claim 1, wherein storing the data in the first memory comprises storing the data according to the FIFO principle.

10. The method of claim 1, wherein storing data Of the first memory in the second memory comprises storing the data after a predefined time has elapsed following detection of the occurrence of the event.

11. The method of claim 1, wherein determining the occurrence of the predefined event comprises evaluating data using an evaluation algorithm and comparing the result with one or more predefined events.

12. The method of claim 1, further comprising setting the predefined events.

13. The method of claim 1, further comprising classifying the predefined events.

14. The method of claim 1, further comprising combining the data to form data sets.

15. The method of claim 1, further comprising storing the data with a time stamp.

16. The method of claim 1, further comprising configuring the beginning, the end, or both the beginning and the end of the data storage in the first memory.

17. The method of claim 1, further comprising setting the amount of data stored in the second memory before, after, or both before and after the occurrence of the predefined event.

18. The method of claim 1, wherein the data relating to the plasma process power delivery system includes data relating to one or more of the plasma process within or near a plasma chamber of the plasma process power delivery system, and environmental parameters associated with the plasma process power delivery system.

19. The method of claim 1, wherein the event within the plasma process power delivery system includes events within or near a plasma chamber of the plasma process power delivery system, and events within an environment of the plasma process power delivery system.

20. A plasma process power delivery system comprising:
   one or more sensing devices within the plasma process power delivery system;
   a controller in communication with the one or more sensing devices;
   a first memory;
   a second memory;
   a data transmission connection between the first memory and the second memory and being configured to transmit data relating to the plasma process power delivery system between the first memory and the second memory in response to an occurrence of a predefined event ascertained by one or more sensing devices; and
   a plasma process monitoring system in communication with the second memory and configured to analyze circumstances associated with the event that triggers the storage in the second memory using the data stored in the second memory.

21. The plasma process power delivery system of claim 20, wherein the one or more sensing devices comprise one or more of sensors and measuring devices.

22. The plasma process power delivery system of claim 20, wherein the circumstances associated with the event include one or more of circumstances that caused the event and circumstances that were present following the occurrence of the event.

23. The plasma process power delivery system of claim 20, further comprising an evaluation device that determines the occurrence of the predefined event from the signals of the one or more sensing devices.

24. The plasma process power delivery system of claim 20, wherein the first memory is a volatile memory and the second memory is a non-volatile memory.

25. The plasma process power delivery system of claim 20, wherein the first memory is a ring memory.

26. The plasma process power delivery system of claim 20, wherein the second memory is a component of the plasma process monitoring system.

27. The plasma process power delivery system of claim 26, wherein the plasma process monitoring system includes a computer with a hard disk.

28. The plasma process power delivery system of claim 20, further comprising means for predefining events, for classifying events, for configuring a memory module of the first memory, or for determining the amount of data stored in the second memory before and after the occurrence of the predefined event.

29. The plasma process power delivery system of claim 20, wherein the first memory is within a power generator that generates power for supplying a plasma process in a plasma chamber.

30. The plasma process power delivery system of claim 29, wherein the plasma process monitoring system is external to the power generator.

31. The plasma process power delivery system of claim 29, wherein, the first memory is within the controller.

32. The plasma process power delivery system of claim 31, wherein the controller is within the power generator.

33. The plasma process power delivery system of claim 20, further comprising an evaluation device that determines whether the predefined event has occurred based on information from the one or more sensing devices.

34. The plasma process power delivery system of claim 33, wherein the evaluation device is within a power generator that generates power for supplying a plasma process in a plasma chamber.

* * * * *

UNITED STATES PATENT AND TRADEMARK OFFICE
CERTIFICATE OF CORRECTION

PATENT NO. : 8,190,969 B2
APPLICATION NO. : 11/750573
DATED : May 29, 2012
INVENTOR(S) : Markus Winterhalter et al.

It is certified that error appears in the above-identified patent and that said Letters Patent is hereby corrected as shown below:

Title page, Item (75) column 1, after "Ekkehard Mann," delete "Grundelfingen" and insert --Gundelfingen--.

Column 10, line 10 (Claim 10, line 1) delete "Of" and insert --of--.

Column 12, line 12 (Claim 31, line 2) delete "wherein," and insert --wherein--.

Signed and Sealed this
Seventh Day of August, 2012

David J. Kappos
*Director of the United States Patent and Trademark Office*